United States Patent [19]
Wells et al.

[11] Patent Number: 5,455,800
[45] Date of Patent: Oct. 3, 1995

[54] APPARATUS AND A METHOD FOR IMPROVING THE PROGRAM AND ERASE PERFORMANCE OF A FLASH EEPROM MEMORY ARRAY

[75] Inventors: Steven E. Wells, Citrus Heights; Neal Mielke, Los Altos Hills, both of Calif.

[73] Assignee: Intel Corporation, Santa Clara, Calif.

[21] Appl. No.: 329,773

[22] Filed: Oct. 27, 1994

Related U.S. Application Data

[63] Continuation of Ser. No. 19,607, Feb. 19, 1993, abandoned.

[51] Int. Cl.$^6$ .................................................. G11C 7/00
[52] U.S. Cl. ................ 365/218; 365/189.09; 365/185.26
[58] Field of Search .................... 365/189.11, 185, 365/900, 189.09, 218, 226; 307/269, 296.2, 296.4

[56] References Cited

U.S. PATENT DOCUMENTS

| | | | |
|---|---|---|---|
| 4,710,647 | 12/1987 | Young | 307/269 |
| 4,888,738 | 12/1989 | Wong et al. | 365/218 |
| 5,255,224 | 10/1993 | Galbi et al. | 365/189.11 |
| 5,265,052 | 11/1993 | D'Arrigo et al. | 365/185 |
| 5,267,218 | 11/1993 | Elbert . | |
| 5,274,599 | 12/1993 | Ema | 365/218 |
| 5,295,113 | 3/1994 | Dix et al. | 365/218 |
| 5,313,429 | 5/1994 | Chevallier et al. | 365/218 |
| 5,331,592 | 7/1994 | Yamagata | 365/218 |
| 5,357,463 | 10/1994 | Kinney | 365/218 |

FOREIGN PATENT DOCUMENTS

| | | |
|---|---|---|
| 2088442 | 7/1993 | Canada . |
| 0392895 | 10/1990 | European Pat. Off. . |
| 2251323 | 1/1992 | United Kingdom . |
| 2251324 | 1/1992 | United Kingdom . |

OTHER PUBLICATIONS

Maxim+12V/+15V Step-Up Current-Mode PWM Regulators Advertisement, Maxim Integrated Products, 193966, Rev 1, 12 pages (Mar. 1992).

Primary Examiner—Tan T. Nguyen
Attorney, Agent, or Firm—Blakely, Sokoloff, Taylor & Zafman

[57] ABSTRACT

A voltage Vpp is provided for use in programming and erasing transistors which transistors normally switch with a voltage Vpp centering at X volts in a range varying from X plus Y to X minus Y volts. When transistors in an array are selected to operate in this range, a significant number of the blocks of memory transistors require as much as three times as long to program and erase as do typical memory transistors. The invention provides circuitry for furnishing a voltage Vpp to program and erase the blocks of the memory array which voltage is controlled to be in a range of X to X+Y volts and centers around X+½ Y volts.

7 Claims, 5 Drawing Sheets

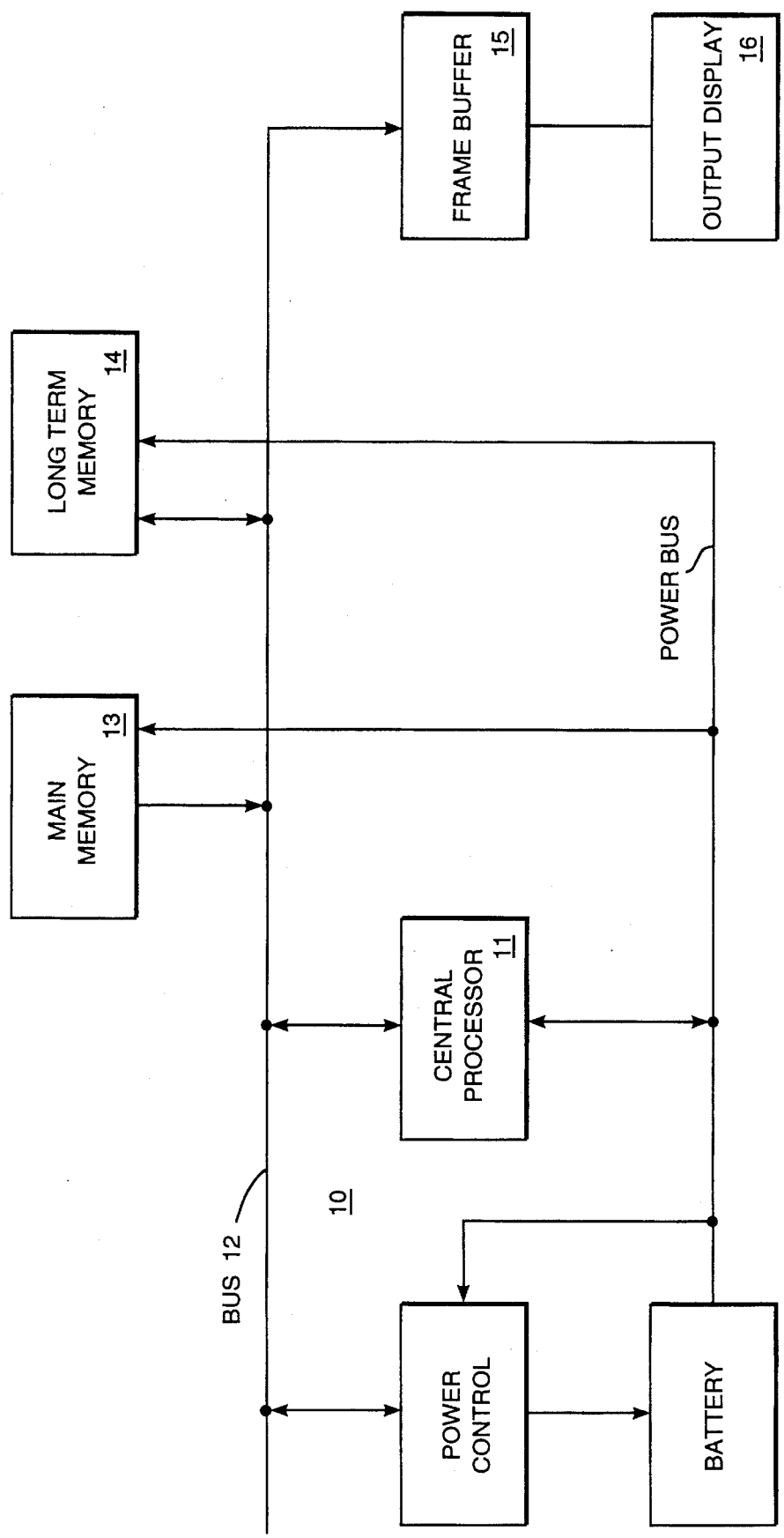
FIG_1

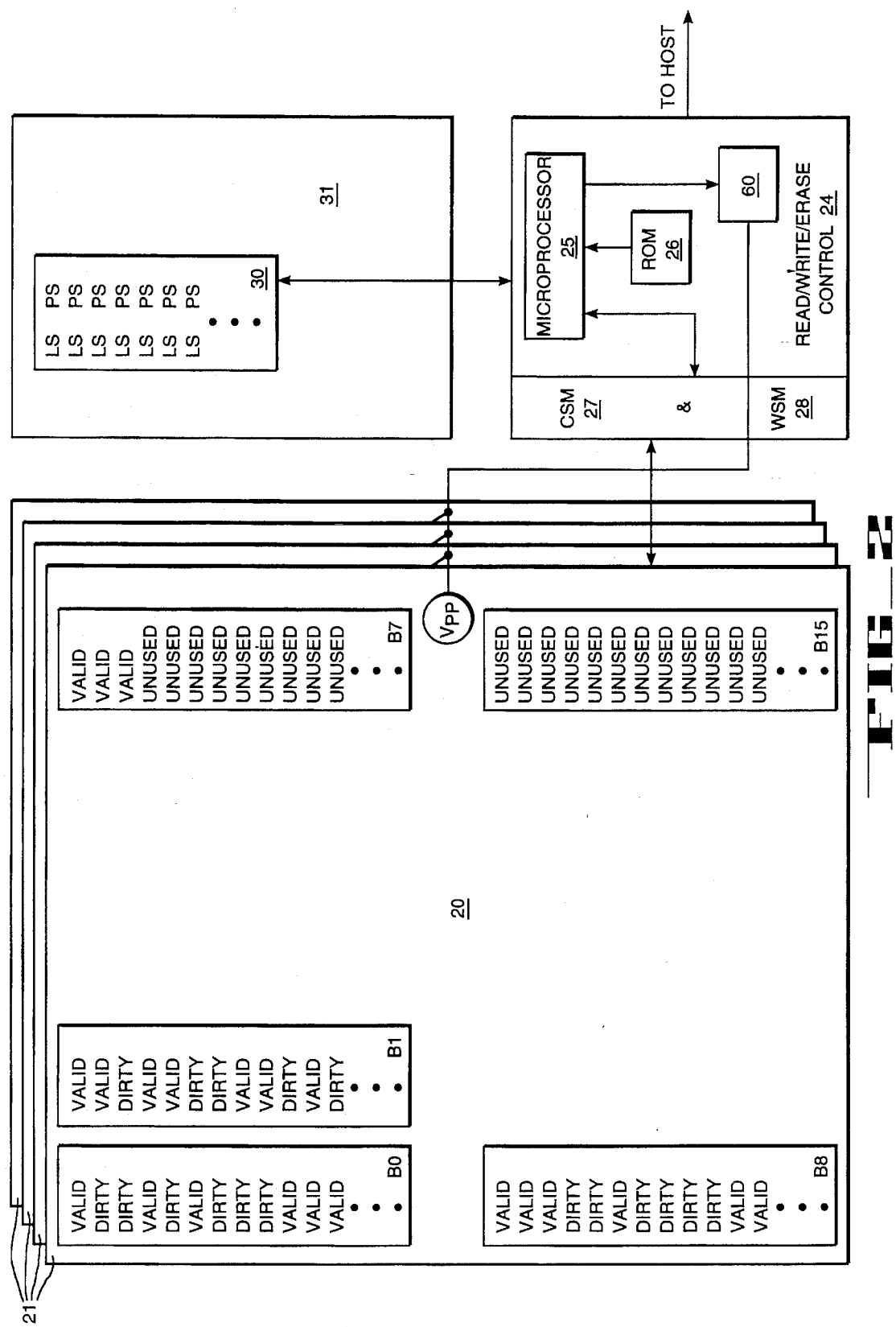

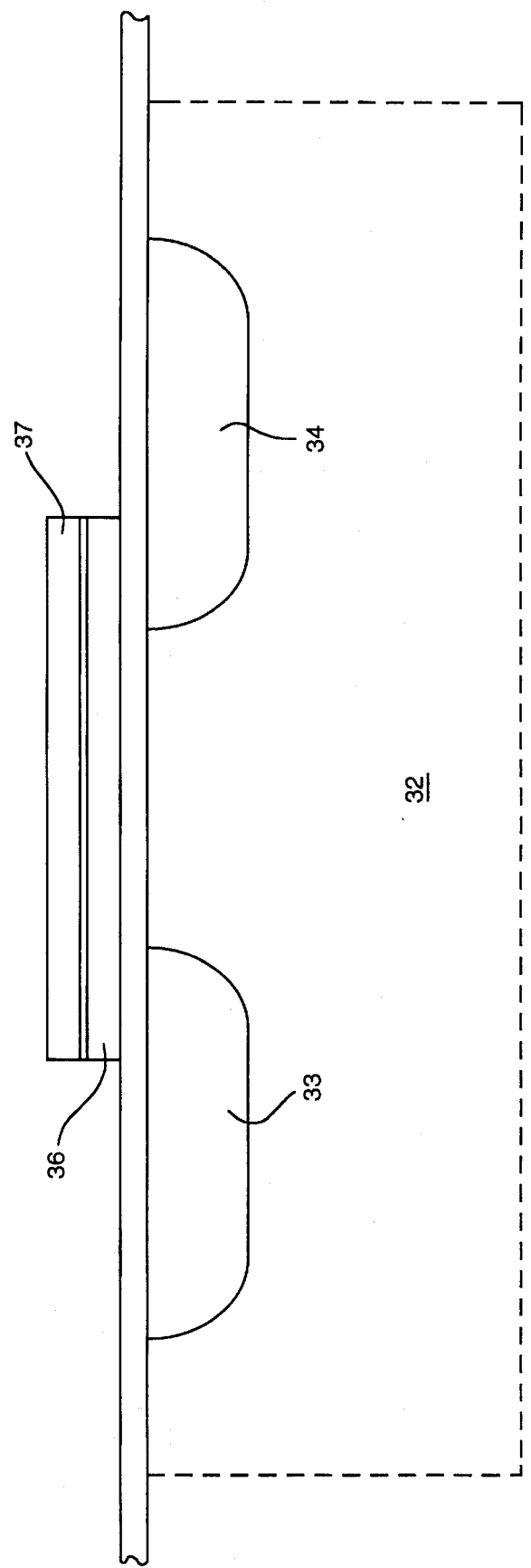

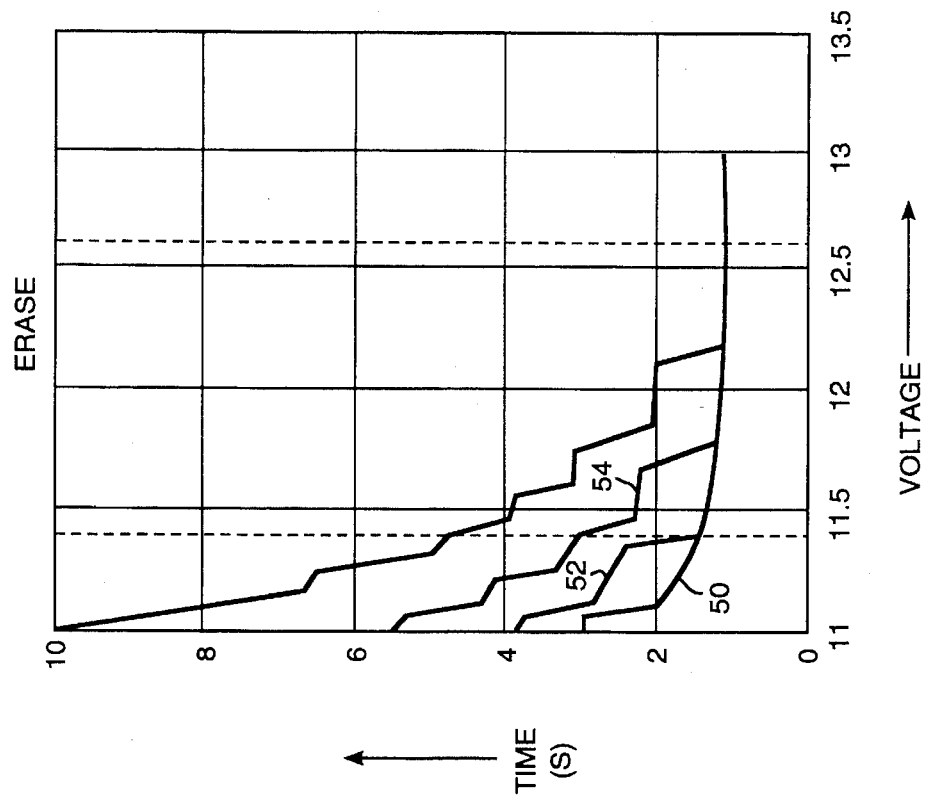
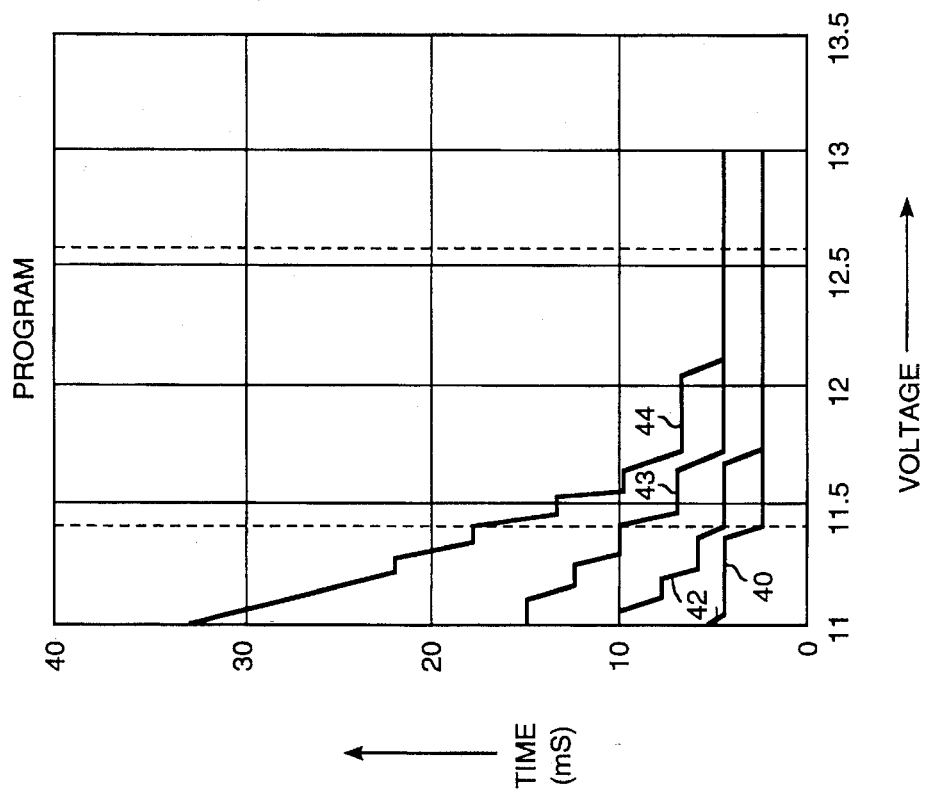

APPARATUS AND A METHOD FOR IMPROVING THE PROGRAM AND ERASE PERFORMANCE OF A FLASH EEPROM MEMORY ARRAY

This is a continuation of application Ser. No. 08/019,607, filed Feb. 19, 1993 abandoned.

BACKGROUND OF THE INVENTION

1. Field Of The Invention

This invention relates to memory arrays and, more particularly, to apparatus for increasing the speed of erase and programming operations in a flash electrically erasable programmable read only memory (flash EEPROM) array.

2. History Of The Prior Art

Modern computer systems make extensive use of long term memory. Typically this memory is provided by one or more electro-mechanical hard (fixed) disk drives constructed of flat circular magnetic disks which rotate about a central axis and which have a mechanical arm to write to or to read from positions on the magnetic disk. Hard disk drives are very useful and have become almost a necessity to the operation of personal computers. However, such electro-mechanical drives are relatively heavy, require a significant amount of space within a computer, require a significant amount of power in use, and are very susceptible to shock. A hard drive within a portable computer which is dropped is quite likely to cease functioning with a catastrophic loss of data.

Recently, forms of long term storage other than electro-mechanical hard disk drives have become feasible for use in computers. One of these is flash EEPROM. A flash EEPROM memory array includes a large plurality of floating-gate field effect transistors arranged as memory cells in typical row and column fashion with circuitry for accessing the individual cells and placing the memory transistors of those cells in one of two memory conditions. A flash EEPROM memory cell, like a typical EPROM cell retains information when power is removed. Unlike a typical EPROM cell, however, a flash EEPROM cell may be erased electrically in place within a system.

Flash EEPROM memory has a number of characteristics which adapt it to use as long term memory. It is light in weight, occupies very little space, and consumes less power than electro-mechanical disk drives. More importantly, it is especially rugged. It will withstand without adverse effects repeated drops each of which would destroy a typical electro-mechanical hard disk drive.

A difficulty with flash EEPROM, however, is that it must be erased before it can be reprogrammed and it is very slow to erase. Flash EEPROM is erased by applying a high voltage simultaneously to the source terminals of all of the transistors (cells) used in the memory while the other terminals are suitably biased. Because these source terminals are all connected to one another by metallic busing in the array, the entire array must be erased at once. While an electro-mechanical hard disk drive will typically store information in a first area of the disk and then rewrite that same area of the disk when the information changes by changing the magnetic fields stored in the area, this is not possible with a flash memory array without erasing all of the valid information that remains in the array along with the invalid (dirty) information.

Because of this, a different arrangement is used for erasing dirty sectors of a flash EEPROM array. One such arrangement is disclosed in detail in U.S. patent application Ser. No. 07/969,131, entitled *A Method and Circuitry for A Solid State Memory Disk*, S. Wells et al, filed on Oct. 30, 1992, and assigned to the assignee of the present invention. First, the entire array is divided into smaller separately erasable blocks so that when a block is erased the amount of valid data which must be reprogrammed is reduced. Typically, the array is composed of a number of silicon chips; and each such chip includes a number of such blocks. Then, when the information at a data entry changes, the changed information is written to a new sector on an available block rather than written over the old data; and the old data is marked dirty. After some period, the management processes controlling the block will determine that it is necessary to release space tied up in dirty sectors and select a block to clean up. When cleanup occurs, all of the valid data in the selected block is first written to a new block with free space; and then the dirty block is erased and put back into use as a clean block of memory. Because of this involved process, it typically takes as much as two seconds to clean up a block of a flash EEPROM array. However, because erasure need not occur with each entry which is rewritten, erasure may be delayed until a block contains a sufficient amount of dirty information that cleanup is feasible. This reduces the number of erasure operations to a minimum and allows erasure to occur in the background when the facilities for controlling the array are not otherwise occupied with reading and writing.

Even though the erasing and attendant clean up processing may be accomplished in the background, it is desirable to accelerate as much as possible these and other operations of a flash EEPROM array which is used as long term memory. It has been discovered that a substantial problem affecting the speed of erasure of a flash EEPROM array is that the processes for manufacturing such products produce blocks of memory which require as much as three times the typical time in order to erase. These same blocks appear to exhibit the same slow switching speed when being programmed. Since the entire memory array is required to provide sufficient switching time that its slowest block of memory will respond, the entire array must switch at the slower speeds required by the slowest blocks in programming and erasure. It is desirable to improve the rate of switching of those blocks of a flash EEPROM array which are slower to erase and program so that the speed of the memory array may be improved.

SUMMARY OF THE INVENTION

It is, therefore, an object of the present invention to improve the rate at which erase and programming operations take place in a flash EEPROM memory array.

It is another object of the present invention to improve the switching rate of the slowest blocks to erase and program in a flash EEPROM memory array.

These and other objects of the present invention are realized in apparatus for providing voltage Vpp for use in programming and erasing transistors which transistors are normally switched with a voltage Vpp centering at X volts in a range varying from X plus Y to X minus Y volts but when transistors in an array are selected to operate in this range, a significant number of the blocks of memory transistors require as much as three times as long to program and erase as do typical memory transistors in that range. The apparatus includes circuitry for furnishing a voltage Vpp to program and erase the blocks of the memory array which voltage is controlled to be in a range of from X to X+Y volts and centers around X+½ Y volts.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a block diagram of a computer in which the present invention may be utilized.

FIG. 2 is a block diagram illustrating a flash EEPROM array in which the present invention may be utilized.

FIG. 3 is a cross sectional illustration of a single memory transistor used in a flash EEPROM array.

FIG. 4 is a diagram illustrating a distribution curve for the programming of blocks of flash EEPROM transistors.

FIG. 5 is a diagram illustrating a distribution curve for the erasing of blocks of flash EEPROM transistors.

Notation And Nomenclature

Figure 6:
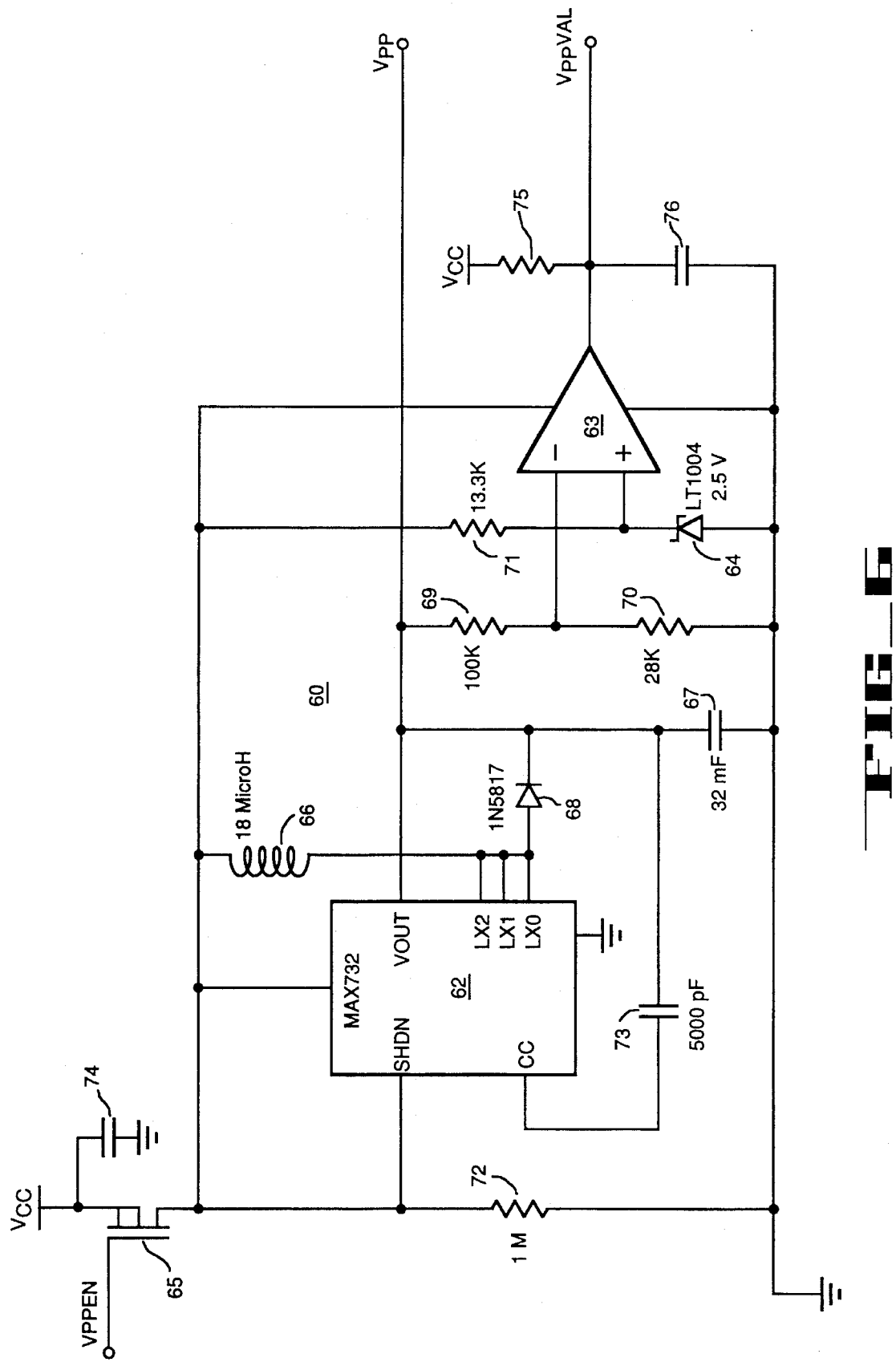
FIG. 6 is a diagram illustrating a circuit which may be used in the flash EEPROM array of FIG. 2 to assist in practicing the invention.

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. In all cases the distinction between the method operations in operating a computer and the method of computation itself should be borne in mind. The present invention relates to apparatus for operating a computer in processing electrical or other (e.g. mechanical, chemical) physical signals to generate other desired physical signals.

Detailed Description

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Also connected to the bus 12 is main memory 13 which is typically constructed of dynamic random access memory arranged in a manner well known to those skilled in the prior art to store information being used by the central processor during the period in which power is provided to the system 10.

Also connected to the bus 12 are various peripheral components such as long term memory 14. Although long term memory 14 is typically provided by one or more electro-mechanical hard disk drives, such memory may also comprise flash EEPROM memory arrays constructed in a manner to replace the typical electro-mechanical hard disk drives. Such a flash EEPROM memory array is utilized in practicing the present invention. In addition to long term memory 14 and other peripheral components, circuitry may also be coupled to the bus 12 such as a frame buffer 15 to which data may be written for transfer to an output display device 16. Circuitry well known to those skilled in the art may also be utilized to provide power for portable computers in which the present invention is expected to find substantial use.

As outlined above, a flash EEPROM memory array includes a large plurality of transistors arranged as memory cells in an array with circuitry for accessing individual cells and placing the memory transistors of those cells in one of two memory conditions. A flash memory cell, like a typical EPROM cell, retains information when power is removed. However, unlike the typical EPROM cell, a flash EEPROM cell may be electrically erased in place.

Because flash EEPROM cannot be reprogrammed until it has been erased and because only large portions of such an array can be erased at any time, all of the valid information that remains in a portion of the array which is to be erased must be rewritten to some other area of the array each time the portion of the array is erased or it will be erased along with the invalid "dirty" information in the portion of the array being erased. Since the running of the erase process requires the rewriting of all valid data, the preconditioning of the memory cells before erase, and post erasure repair, the erase process is quite slow; it typically requires between one and two seconds to erase a flash EEPROM array. Such an erase time would seem to preclude the use of flash EEPROM for rapidly changing data.

However, flash EEPROM may be used for long term storage of the rapidly changing data typically stored by an electro-mechanical hard disk if some method of erasing and rewriting the flash array is devised which is different than that typically used for electro-mechanical hard disks and does not slow the overall operation of the system.

In the new arrangement for erasing and rewriting a flash EEPROM array disclosed in the U.S. patent application entitled *Method and Circuitry for a Solid State Memory Disk*, referred to above, a long term storage array is comprised of flash memory arranged in a series of blocks, each of which blocks is independently erasable. Each of the logical blocks of flash memory is separately erasable from all other such blocks. However, each of the logical blocks of the array typically holds 128 kilobytes of data, sufficient to hold 256 sectors of information normally stored on the tracks of an electro-mechanical hard disk drive. A typical flash memory array includes 240 blocks and holds about the same amount of data as does a thirty megabyte electro-mechanical hard disk. Even with this division of data into 240 individually-erasable blocks, erasure of a block effects erasure of such a very large amount of information that to attempt to erase all of the data and then replace the valid data by rewriting each sector each time data is updated would be a practical impossibility.

In order to overcome this problem, in the new arrangement referred to above, data is written to any physical block of the flash memory array which has space available. Thus, data is written to an empty position in the array no matter what the apparent address of the data or the address on the block. A piece of data is written to the next available sector of the block being written, and a lookup table is kept which records the physical position on the block with the logical address. This arrangement of the array allows a first block to be written sector by sector, a second block to be written in the same sequential manner, and so on. When the data in a sector changes so that the sector needs to be rewritten, the data is written to a new physical position, the data in the lookup table is changed to record the new physical position along with the logical sector number, and the first position at which the data was written is marked as dirty. After some period of time, a sufficient number of blocks will be filled that it will be desirable to release space by moving the valid information from some especially dirty block to some other block and erasing the entire block from which the valid information has been moved. This has the effect of freeing up an additional number of sectors equal to all of the sectors on the erased block which have previously been marked as dirty.

An especial advantage of the arrangement is that it allows the erasure of blocks to occur in the background. That is, erasure may be arranged to occur when the facilities of the array are not otherwise occupied with reading and writing. In this manner, the external host which is writing to and receiving information from the flash array is typically not aware that an erasure is taking place even though the erasure requires one or two seconds.

Referring now to FIG. 2, there is illustrated in block diagram form a flash EEPROM memory array 20 in which the present invention may be practiced. The array 20 includes a plurality of blocks B0–B15 of flash EEPROM memory. Each block includes floating-gate field effect transistor memory cells (not shown) arranged in typical row and column fashion and having circuitry arranged for selecting any particular block of memory and any particular row and column so that the memory device at that position may be written or read. The details of the layout of transistor memory arrays and the associated accessing circuitry are well known to those skilled in the art and are, therefore, not shown here.

Flash memory is essentially an EPROM array with facilities provided so that entire array (or an individually erasable block) may be erased by a high voltage value applied simultaneously to the source terminals of all the memory transistors of the array with the other terminals suitably biased. Such an erasure places each of the cells in the one condition. When in that condition, a zero or a one may be written to a cell. A one leaves the cell in the same one condition while a zero switches the cell to the zero condition. A cell cannot be switched back from the zero condition to the one condition without the application at its source terminal of the high value of voltage (Vpp) required for erasure. Since the source terminals of all of the memory transistors in a block are joined together, a cell in a zero state remains in that state until the entire block is erased once again.

In the array 20 of FIG. 2, blocks B0–B15 of memory are illustrated positioned on a first chip 21 of the array 20. Additional silicon chips 21 (e.g., thirty) each hold additional blocks of the array 20 to provide a total of 240 blocks in one embodiment. Once any one of the blocks has been erased, data may be written to any position on the entire block. The operations of reading, writing, and erasing the array 20 are controlled by a control circuit 24 which receives commands and data from the host. The control circuit 24 includes among other things a microprocessor 25 and read only memory 26 which may store processes for operating the microprocessor to accomplish the various control operations described in this specification. In one embodiment of the invention, the read only memory 26 is also a flash EEPROM memory array. The microprocessor 25 and read only memory 26 are used to carry out the processes in accordance with the present invention. For the purpose of this invention, the control circuit 24 may also be considered to include a command state machine 27 and a write state machine 28. Although discussed as a part of the control circuit 24, in one embodiment the command state machine 27 and the write state machine 28 are physically a part of each chip 21.

The microprocessor 25 of the control circuit 24 runs the various processes stored in the read only memory 26 to control and manage the reading, writing, and erasure of the array 20. The command state machine 27 provides a command interface between the control circuit 24 and the flash EEPROM memory array 20. The command state machine 27 controls the actual transfer of all data sent to and from the flash memory array 20. The command state machine 27 sequences the data transferred from the host (using the write state machine 28) and to the host so that the writing to and reading from the array 20 occur in proper order. A command state machine 27 and a write state machine 28 used for these purposes are described in detail in U.S. patent application Ser. No. 07/655,643, entitled *Command State Machine,* Fandrich et al, filed Feb. 11, 1991, and assigned to the assignee of the present invention, and in U.S. patent application Ser. No. 07/654,375, entitled *Circuitry and Method For Programming and Erasing A Non-volatile Semiconductor Memory,* Kynett et al, filed Feb. 11, 1991, and assigned to the assignee of the present invention.

When a host begins writing data to be stored in the array 20 to some block of the array which has been completely erased, the data to be stored is written sequentially, sector by sector, to that block until that block has been filled with data. Then writing proceeds to the next sequential block having free space. At any point after writing is completed, the information may be read back from the array 20 by interrogating the block and sector at which the data is stored.

In accordance with the arrangement described above, the data is stored in logical sectors which are similar to the physical sectors utilized in storing data on the typical electro-mechanical hard disks of the prior art except that the sectors may be of any size. When the data in a sector changes, the changed data is written to a new empty sector location on some one of the blocks of the array 20, typically the next empty sector location in physical sequence. This, rather than writing over the old information, occurs because the old information can only be rewritten if the entire block on which it is stored is erased. Consequently, the new information is written to a new position on an unfilled block (e.g., block B7), and the old position is marked invalid (dirty) by writing zeroes with the data stored (in a manner to be explained below) to indicate that the data is invalid. It will be recognized that a value of zero may be written to any memory cell without erasing the block of the array.

Because of the arrangement by which data is replaced, the sector number which is used to indicate where data is stored is a logical sector number rather than a physical sector number. This should be contrasted with the physical sector number used to arrange data on the typical electro-mechanical hard disk. In order to allow this to occur, a lookup table 30 (which is stored in a part of a random access memory 31 associated with the controller 24) is utilized with the array 20 so that the physical position in the array 20 at which any particular logical sector exists may be determined.

Also, because of this arrangement by which data is replaced, each block of the array 20 will after some time have a number of entries which are marked dirty and cannot be used for storage. Consequently, the array 20 fills with data as the data previously stored is changed; and a point will come when it is necessary to clear the dirty information from a block in order to provide space for new or changed information to be stored. Typically, the dirtiest block of the array 20 is chosen for erasure. This allows the smallest amount of data to be moved out to another block of the array since the invalid data need not be moved. Once the valid information is written to another block and the new addresses are recorded in the lookup table 30, the block from which the information was read is erased. It is then placed back in operation as an entirely clean block. In order to allow this "cleanup" operation to occur, some number of blocks must be kept in reserve to be used when cleanup is necessary.

The unusual arrangement for rewriting data used by a flash memory array requires that the memory allocation system continually make new or newly-erased free memory space available for data to be written and rewritten. This requires that some number of blocks of the array always be available in order to allow blocks holding dirty data to be cleaned up and their dirty sectors released. Thus, the operation of the flash EEPROM array requires that the transistor devices which make up the array be constantly programmed and erased.

FIG. 3 illustrates a single memory transistor 32 of the type used in a flash memory array shown in partially completed form. As may be seen, the transistor 32 is a floating gate MOS field effect transistor having a drain region 33, a source region 34, a floating gate 36, and a control gate 37. The source region 34 and the drain region 33 are embedded in the silicon substrate material which separates the two areas and are typically doped with an arsenic dopant, and the source region may be additionally doped with a phosphorous dopant. The polysilicon floating gate 34 is generally disposed between the drain and source regions and insulated from them by a layer of silicon dioxide. The control gate 37 is insulated from the floating gate 36, typically, by a layer of silicon dioxide. The N channel device may be fabricated directly in a P type substrate or formed in some other well known manner. Conductors are connected to each of the drain 33, source 34, and control gate 37 for applying signals to affect the flow of electrons and holes between the various parts of the transistor 32. In one embodiment, the control gate 37 is fabricated on a second layer of polysilicon and is part of a continuous strip of polysilicon forming a word line in the array of which the transistor is a part. The transistor may be constructed using well-known CMOS technology.

Floating gate transistors are programmed by negatively charging the floating gate 36 by coupling the word line connected to the control gate 37 to a high potential (typically approximately +12 volts), the drain region to a lower potential (typically approximately +7 volts), and the source region to ground. With these conditions, channel hot electron injection occurs through the oxide layer 36. To erase the cell, the drain region is floated, the word line connected to the control gate 37 is grounded, and a high potential (typically +12 volts) is applied to the source region. Under these conditions, charge is tunneled from the floating gate. A cell is read by applying a positive potential (less than that which would cause charge to transfer onto the floating gate) to the control gate 37, applying ground to the source region, and applying a low potential (typically one volt) to the drain region. Current through the device is sensed to determine if the floating gate is or is not negatively charged. If there is charge on the floating gate, then no drain current flows when a cell is read. Thus, a programmed cell produces a zero output value when interrogated. In contrast, if the transistor has not been programmed and no charge exists on the floating gate, then drain current flows when the cell is read. Thus, a transistor 32 which has not been programmed provides an output of one when interrogated.

It is, therefore, typical that a block of an array of flash EEPROM memory cells are all erased, that is, placed in the condition in which no charge is stored on the floating gate and in which interrogation will produce a one value prior to data being first stored in the array. This is accomplished by providing a high voltage Vpp (typically twelve volts) to the source terminals of all of the memory transistors at once while holding the gate terminals at ground and floating the drain terminals. Then once the cells have been erased, as data is stored in the memory cells of the block, those cells which are to store a one condition remain in the condition in which they were placed by erasure while those cells which are to store a zero condition are switched to the programmed condition.

When a sufficient amount of a block of the array contains invalid information that it is time to again erase the array, this is accomplished in a two step process. First, all of the cells in the one condition are programmed to the zero condition; and then the entire block is erased by applying the high voltage at the source terminals of all of the cells.

From the above discussion, it will be seen that the ability of a memory transistor to provide a value of one or zero depends upon whether charge is stored or is not stored on the floating gate. As would be expected, the amount of charge stored by each of the memory cells of a flash memory array is not identical to that stored by all other memory cells but varies in a typical distribution pattern.

A statistical study of blocks of flash EEPROM memory arrays has shown that when other factors are held constant, typical blocks of the array exhibit distribution patterns for time to program a sector of 512 bytes of information vs. switching voltage such as those illustrated in FIG. 4 when the memory transistors are being programmed. That is, a typical block of memory transistors follows a curve such as the curve 40. As may be seen in FIG. 4, when a switching voltage Vpp of exactly 12 volts is applied in a programming operation, the devices of a typical block programs a 512 byte sector in approximately 2.5 milliseconds. When the voltage is raised to a value of 12.6 volts (the upper end of the device range), the devices of a typical block require approximately 2.5 milliseconds to switch condition. When the voltage is lowered to a value of 11.4 volts at the lower end of the device range, the devices of a typical block require approximately 2.5 milliseconds to switch condition. Thus for typical blocks of the array, a period of at least 2.5 milliseconds is all that is necessary to be provided in order for the memory transistors of the block to switch condition when being programmed (written) for 512 bytes.

However, statistically approximately one-third (referred to in statistical terms as one sigma) of all blocks of memory transistors fall into a distribution pattern such as that illustrated by the curve 42 illustrated in FIG. 4. In fact, the curve illustrated represents the slower switching one-third of all blocks of a flash memory array. These blocks of memory transistors follow a curve such so that when a switching voltage Vpp of exactly 12 volts is applied in a programming operation, the devices of a typical block still require approximately 2.5 milliseconds to switch condition. When the voltage is raised to a value of 12.6 volts, the devices of this block require the same 2.5 milliseconds to switch condition. However, when the voltage is lowered to a value of 11.4 volts, the devices of this block require approximately 4.5 milliseconds to switch condition. Thus, for these blocks of the array, a period of at least 4.5 milliseconds must be provided in order for the memory transistors of the block to switch condition when being programmed.

An additional approximately five percent (statistically referred to as two sigma) of all blocks of memory transistors fall into a distribution pattern such as that illustrated by the curve 43 shown in FIG. 4. These blocks of memory transistors follow a curve such so that when a switching voltage Vpp of exactly 12 volts is applied in a programming operation, the devices of a typical block require approximately 4.5 milliseconds to switch condition. When the voltage is raised to a value of 12.6 volts, the devices of this block require the same 4.5 milliseconds to switch condition. However, when the voltage is lowered to a value of 11.4 volts, the devices of this block require approximately ten milliseconds to switch condition. Thus for these blocks of the array, a period of at least ten milliseconds must be provided in order for the memory transistors of the block to switch condition when being programmed.

Finally, at least some significant number of blocks (three sigma in the study) fall into a category described by the curve 44 in FIG. 4. As may be seen, the memory transistors of these blocks follow a curve such that when a switching voltage Vpp of exactly 12 volts is applied in a programming operation, the devices of such a block require six milliseconds to switch condition. When the voltage is raised to a value of 12.6 volts, the devices of this block still require six milliseconds to switch condition. When the voltage is lowered to a value of 11.4 volts, the devices of this block require eighteen milliseconds to switch condition. Thus for this blocks of the array, a period of at least eighteen microseconds must be provided in order for the memory transistors of the block to switch condition when being programed. Thus, with three sigma blocks of memory, the programing operation takes 2.7 times as long at 11.4 volts as it does at 12.0 volts; with two sigma blocks, the programming operation takes 2.2 times as long at 11.4 volts as at 12.0 volts; with one sigma blocks, 1.7 times as long as at 12.0 volts; while typical parts program at the same speed at 11.4 volts and 12.0 volts.

In prior art flash EEPROM memory arrays it has been typical to provide high voltages Vpp within a range of 11.4 to 12.6 volts for switching the memory transistors during either the program or erase operation. This means that even though the typical block of memory transistors required only 2.5 milliseconds to switch condition when being programmed using a high potential Vpp of 11.4 volts, a less typical block required 4.5 milliseconds to program using this voltage. Moreover, at least five percent of the blocks in a flash EEPROM memory array required at least ten milliseconds to program and some take as long as eighteen milliseconds. Since a typical array includes 240 blocks of memory transistors, and since each chip contains twenty blocks of memory transistors, each chip of the array will on an average contain one of the slowest switching blocks of transistors. Consequently, the entire array must be programmed at the least speed to be expected for the slowest of these blocks of memory transistors even though a typical transistor memory block programs at over seven times that speed.

FIG. 5 is a similar set of curves representing the statistical patterns of blocks of memory transistors subjected to different high voltages during erase of the memory transistors. As may be seen, the typical block of memory transistors follows a curve such as the curve 50. As may be seen in FIG. 5, when a switching voltage Vpp of exactly 12 volts is applied in a erasing operation, the devices of a typical block require approximately one second to switch to the erased condition. When the voltage is raised to a value of 12.6 volts, the devices of a typical block still require approximately one second to switch condition. When the voltage is lowered to a value of 11.4 volts, the devices of a typical block require approximately one-and one-half seconds to switch condition. Thus for typical blocks of the array, a period of at least one and one-half seconds must be provided in order for the memory transistors of the block to switch condition when being erased.

On the other hand, thirty-three percent (one sigma) of blocks of memory transistors fall into a distribution pattern such as that illustrated by the curve 52 illustrated in FIG. 5. That is, the block of memory transistors follows a curve such so that when a switching voltage Vpp of exactly 12 volts is applied in an erasing operation, the devices of this block require one second to erase. When the voltage is raised to a value of 12.6 volts, the devices of this block still require one second to switch condition. When the voltage is lowered to a value of 11.4 volts, the devices of these blocks require approximately one and one-half seconds to switch condition. Thus for these blocks of the array, a period of at least one and one-half seconds must be provided in order for the memory transistors of the block to switch condition when being erased.

However, at least five percent (two sigma) of the blocks fall into a category described by the curve 54 in FIG. 5. As may be seen, the memory transistors of these blocks follow a curve such so that when a switching voltage Vpp of exactly 12 volts is applied in a programming operation, the devices of such a block require just over one second to erase. When the voltage is raised to a value of 12.6 volts, the devices of this block require one second to erase. However, when the voltage is lowered to a value of 11.4 volts, the devices of these blocks require three seconds to switch to the erase condition. Thus for these blocks of the array, a period of at least three seconds must be provided in order for the memory transistors of the block to switch condition when being programmed. Finally, some small percentage of all blocks require two seconds to erase at 12 volts Vpp, one second to erase at 12.6 volts Vpp, and five seconds to erase at 11.4 volts Vpp.

Thus, prior art arrangement would need to allow at least three seconds for the erase operation to complete.

Thus, with three sigma blocks of memory, an erase operation takes 2.7 times longer at 11.4 volts than at 12.0 volts; with two sigma blocks, an erase takes 2.2 times as long at 11.4 volts as at 12.0 volts; with one sigma blocks, an erase takes 1.8 times as long at 11.4 volts as at 12.0 volts; while with typical parts, an erase takes 1.33 times as long at 11.4 volts as at 12.0 volts.

By constraining the voltage provided by the source voltage Vpp to operate about a center value of 12.3 volts and to vary between 12 and 12.6 volts for memory transistors having the specification range described, the present invention provides a significant increase in the speed of operation of the flash EEPROM memory arrays with which the invention is utilized.

Stated more generally, a voltage Vpp is provided for use in programming and erasing transistors which transistors normally switch with a voltage Vpp centering at X volts in a range varying from X plus Y to X minus Y volts. When transistors in an array are selected to operate in this range, a significant number of the blocks of memory transistors require as much as three times as long to program and erase as do typical memory transistors. The invention provides circuitry for furnishing a voltage Vpp to program and erase the blocks of the memory array which voltage is controlled to be in a range of X to X+Y volts and centers around X+½ Y volts. This range is selected so that the bottom of the range eliminates extended switching periods (those greater than 2.2 times the normal switching time at two sigma) for any significant number of blocks of transistors which can be expected in the array. Using this invention, the programming speed of the arrays may be increased so that only 4.5 milliseconds to program two sigma blocks of memory at 12.0 volts vs 10.2 milliseconds to program at 11.4 volts. Similarly, only 1.43 seconds is required to erase two sigma blocks of memory at 12.0 volts vs 3.18 seconds at 11.4 volts FIG. 6 illustrates a circuit by which this may be accomplished. The circuit 60 includes a voltage pump 62 which is selected to produce an output voltage of 12.3 volts. Such a voltage pump 62 may be one furnished for example by Maxim Integrated Products, Inc., Sunnyvale, Cal., and designated the MAX732. Such a voltage pump circuit provides an output which may be selected to vary only 2.5% from a specified value of 12.3 volts so that output values in a range of from 12 to 12.6 volts are produced. In brief, a switching transistor 65 receives an enabling signal VPPEN and applies five volts (Vcc) across an inductor 66 and ground (provided within the voltage pump circuit 62). When the inductor has charged, ground is removed from the inductor 66 so that the inductor 66 charges a capacitor 67 through a diode 68. The voltage across the capacitor 67 is measured at a Vout terminal of the voltage pump 62 to cause the pump 62 to vary the rate of charging of the inductive field and thus of the capacitor 67. Thus, the voltage across the capacitor 67 is precisely controlled to furnish the desired value Vpp.

The circuit 60 also includes a comparator 63 which is connected to provide a feedback signal VppVAL to control the transfer of Vcc to the chips of the array only after the voltage Vpp has risen to the desired value. The voltage across a zener diode 64 (typically 2.5 volts) is used as a control value at one input to the comparator 63, and the output voltage Vpp is divided across a pair of resistors 69 and 70 and provided at a second input to the differential amplifier 63 to produce this result.

The circuit 60 may be a part of the controller circuit 24 described in FIG. 2. The voltage output of the circuit 60 is provided in response to a signal VPPEN from the microprocessor 25 of the control circuit 24 indicating that erase or programming voltage is necessary. The output voltage Vpp is transferred to the high voltage input terminal on each of the chips of the array at which the high voltage Vpp is received.

Another arrangement utilizing a similar voltage pump is described in detail in U.S. patent application Ser. No. 07/993,408 entitled *Precision Voltage Reference*, K. Tedrow et at, filed Dec. 21, 1992, now issued as U.S. Pat. No. 5,339,272, and assigned to the assignee of the present invention. The circuit described therein utilizes a pair of flash EEPROM memory transistors to provide a very precise voltage level output from a voltage pump circuit. Again, such a circuit may be a part of the controller circuit 24 described in FIG. 2. The voltage output of the circuit is provided in response to a signal from the microprocessor 25 of the control circuit 24 indicating that erase or programming voltage is necessary. The output voltage Vpp is transferred to the high voltage input terminal on each of the chips of the array at which the high voltage Vpp is received.

The provision of a high valued switching voltage Vpp capable of providing a precise value of voltage for use in switching flash EEPROM memory cells to both program and erase those cells, and in which the level of the precise voltage is adjusted to a value higher than that typically used to supply such a switching voltage substantially increases the speed of operation of the array.

Although the present invention has been described in terms of a preferred embodiment, it will be appreciated that various modifications and alterations might be made by those skilled in the art without departing from the spirit and scope of the invention. For example, an especially reliable solution to the problem is to use both types of checks to insure reliability of the erase operation. The invention should therefore be measured in terms of the claims which follow.

What is claimed is:

1. In a flash EEPROM array having a plurality of memory cells, wherein each of the memory cells includes a source, a drain, a control gate, and a floating gate, a method of improving erasure of the memory cells, comprising the steps of:

(A) generating a Vpp voltage for erasing the memory cells, wherein due to characteristics variations of the memory cells, some of the memory cells are erased requiring substantially longer than a predetermined time within which other cells of the memory cells are erased if the Vpp voltage varies from X minus Y volts to X volts;

(B) applying the Vpp voltage to the source of each of memory cells for erasure;

(c) allowing the Vpp voltage to vary only within a range of X volts to X plus Y volts and center around X plus Y/2 volts such that substantially all of the memory cells require the predetermined time to erase regardless of the characteristics variations of the memory cells, wherein Y is less than one.

2. The method of claim 1, wherein the step (A) further comprises the step of raising the voltage level of a power supply voltage applied to the flash EEPROM array to generate the Vpp voltage, wherein the voltage level of the Vpp voltage is significantly higher than that of the power supply voltage.

3. The method of claim 2, further comprising the step of applying the power supply voltage to the memory cells of the flash EEPROM array only when the Vpp voltage is within the range of X volts to X plus Y volts and centering around X plus Y/2 volts.

4. The method of claim 1, wherein X is 12 and X plus Y is 12.6.

5. A flash EEPROM, comprising:

(A) an array having a plurality of memory cells, each having a source, a drain, a control gate, and a floating gate, wherein the memory cells can be erased by applying a Vpp voltage to the source of each of the memory cells, wherein each of the memory cells has an erasure characteristics that is different from that of another one of the memory cells such that some of the memory cells are erased requiring substantially longer than a predetermined time within which other cells of the memory cells are erased when the Vpp voltage varies from X minus Y volts to X volts;

(B) a precision voltage generation circuit coupled to receive a power supply voltage for generating and applying the Vpp voltage to the source of each of the memory cells for erasure, wherein the precision voltage generation circuit further comprises (i) a voltage pump circuit coupled to receive the power supply voltage for generating the Vpp voltage, wherein the voltage level of the Vpp voltage is significantly higher than that of the power supply voltage;

(ii) a control circuit for controlling the voltage pump circuit to allow the Vpp voltage to vary only within a range of X to X plus Y volts and center around X plus Y/2 volts such that substantially all of the memory cells require the predetermined time to erase regardless of the erasure characteristics of each of the memory cells, wherein Y is less than one.

6. The flash EEPROM of claim 5, wherein precision voltage generation circuit further comprises a comparator circuit for applying the power supply voltage to the array when the Vpp voltage generated is within the range of X to X plus Y volts.

7. The flash EEPROM of claim 5, wherein X is 12 and X plus Y is 12.6.

* * * * *